United States Patent [19]

Urata et al.

[11] Patent Number: 4,876,703
[45] Date of Patent: Oct. 24, 1989

[54] APPARATUS FOR COMPRESSING AND/OR EXPANDING TIME BASE

[75] Inventors: Kaoru Urata, Kanagawa; Miaki Nakashio, Tokyo; Koichi Ono, Kanagawa; Hitoshi Hirai, Kanagawa; Masayuki Iwamoto, Kanagawa, all of Japan

[73] Assignee: Sony Corp., Tokyo, Japan

[21] Appl. No.: 159,896

[22] Filed: Feb. 24, 1988

[30] Foreign Application Priority Data

Mar. 12, 1987 [JP] Japan .................................. 62-57818

[51] Int. Cl.[4] ....................... G11C 29/00; H03K 23/46
[52] U.S. Cl. ........................................ 377/62; 377/60; 377/58; 358/213.31
[58] Field of Search ...................... 377/60, 61, 63, 62, 377/58; 358/213.31

[56] References Cited

U.S. PATENT DOCUMENTS

3,955,100 5/1976 Takahashi et al. .................... 377/60
4,344,001 8/1982 Tsuchiya et al. ..................... 377/60

Primary Examiner—John S. Heyman
Attorney, Agent, or Firm—Alvin Sinderbrand

[57] ABSTRACT

In an apparatus having a CCD for compressing and/or expanding the time base of an input signal; a first two-phase transfer clock pulse signal made up of first and second pulse train signals having a first period and arranged to be 180° out of phase with each other is used for driving the CCD while writing the input signal into the CCD, a second two-phase transfer clock pulse signal made up of third and fourth pulse train signals having a second period and arranged to be 180° out of phase with each other is used for driving the CCD while reading from the CCD a signal which is produced from the input signal with its time base compressed or expanded, and the pulse width of the first pulse train signal is made virtually equal to the pulse width of the third pulse train signal and such pulse width is selected to be smaller than one-half of the smaller of the first and second periods.

5 Claims, 6 Drawing Sheets

FIG.7D          Reset Voltage

APPARATUS FOR COMPRESSING AND/OR EXPANDING TIME BASE

BACKGROUND OF THE INVENTION

1. Field of the Invention

This invention generally relates to a time base compressing and/or expanding apparatus and, more particularly, is directed to a time base compressing and/or expanding apparatus using a charge coupled device (hereinafter to be called CCD).

2. Description of the Prior Art

Figure 1:
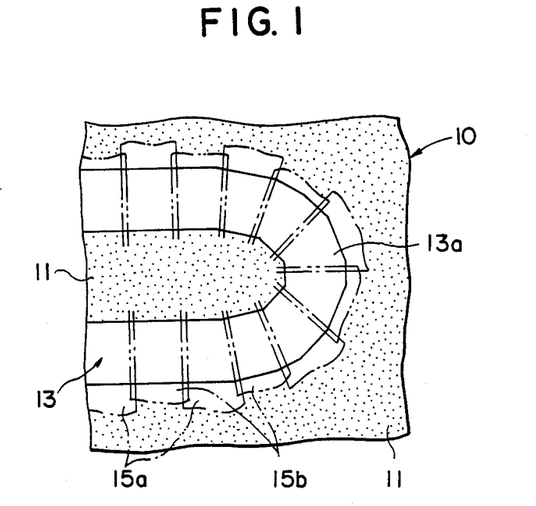
FIG. 1 is a diagrammatic illustration of a bent portion of a charge transfer channel in a CCD.

It is known in the prior art to use a CCD for compressing or expanding the time base of an information signal such as a video signal. The CCD used in such an apparatus is comprised of a semiconductor chip on which a charge transfer channel is formed between channel stop regions and is provided with, for example, transfer electrodes of the two-phase type disposed thereon, and the CCD is driven with a two-phase transfer clock pulse signal applied to the transfer electrodes. Usually, a desired length of the charge transfer channel is achieved by effectively utilizing the space on the semiconductor chip. For the sake of this, the charge transfer channel is arranged with bent portions, as shown in FIG. 1. In the CCD 10 shown in FIG. 1, the charge transfer channel 13 defined between channel stop regions 11 has a bent portion 13a and the transfer of the electric charges is turned from one direction into the opposite direction at the bent portion 13a. On the charge transfer channel 13, there are disposed transfer electrodes 15a and 15b of the two-phase type arranged alternately in the direction along the charge transfer channel 13.

Figure 2:
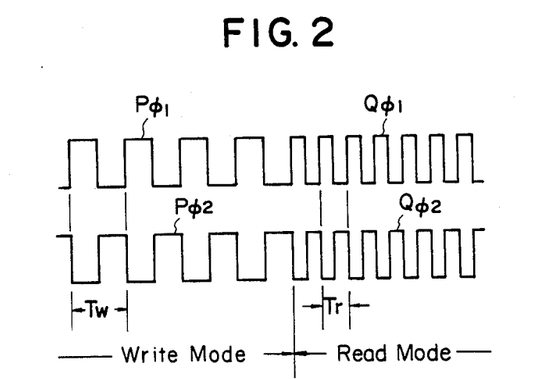
FIG. 2 is a waveform chart showing an example of a two-phase transfer clock pulse signal for the CCD.

When compression or expansion of the time base of a video signal is effected using such a CCD 10, the CCD is driven by a transfer clock pulse signal at a predetermined frequency for writing, whereby the video signal is written in the CCD. Thereafter, the CCD is driven by a transfer clock pulse signal for reading at a different frequency from that of the transfer clock pulse signal for writing, whereby the video signal is read out of the CCD. For example, when a time base compression is performed, during a period in which the CCD is in a write mode, a video signal is supplied to the CCD, and at the same time, the transfer electrodes 15a and 15b disposed on the charge transfer channel 13 are respectively supplied with pulse train signals $P_{\phi 1}$ and $P_{\phi 2}$, as the two-phase transfer clock pulse signal for writing, and which have a duty cycle of 50% and a period of Tw and are 180° out of phase with each other, as shown in FIG. 2. Thereby, the CCD is driven and the signal charge based upon the video signal is transferred through the charge transfer channel 13 and, as a result, the video signal for a predetermined period, for example, for one horizontal line, is written into the charge transfer channel 13.

Then, during a period in which the CCD is in a read mode and which follows a period in the write mode, the transfer electrodes 15a and 15b disposed on the charge transfer channel 13 are respectively supplied with pulse train signals $Q_{\phi 1}$ and $Q_{\phi 2}$, as the two-phase transfer clock pulse signal for reading. Such pulse train signals $Q_{\phi 1}$ and $Q_{\phi 2}$ have a duty cycle of 50% and a period of Tr corresponding, for example, to one-half of the period Tw and are 180° out of phase with each other as shown in FIG. 2. Thereby, the CCD is driven and the signal charge based upon the video signal written in the charge transfer channel 13 is transferred therethrough, and as a result, the video signal for one horizontal line is read out of the charge transfer channel 13. Thus, the video signal written in the CCD with the two-phase transfer clock pulse signal for writing having the period TW is read out from the CCD with the two-phase transfer clock pulse signal for reading having the period Tr corresponding to Tw/2, and thereby, the video signal read out from the CCD becomes a signal whose time base is compressed to one-half of that of the original video signal.

As described in the foregoing, the charge transfer channel of the CCD used, for example, for compressing the time base of a video signal has bent portions as shown in FIG. 1, and it is considered that there are energy "defects" in such bent portions, and therefore, when charges are transferred therethrough, some charges remain untransferred in each such "defect". The quantity of the remaining, or residual, charges in the "defects" varies according to the pulse width of the transfer clock pulse signal at the time of the charge transferring operation. For example, as shown by a curve X in FIG. 3 indicating the relationship between the quantity of the residual charge q in such a "defect" and the pulse width $\tau$ of the transfer clock pulse signal, the smaller the pulse width $\tau$, the larger becomes the quantity of the residual charge q.

Such residual charges produced in the bent portions of the charge transfer channel at the time of charge transfer operation through the charge transfer channel of the CCD do not cause any noise component in the output signal from the CCD as long as the quantity of the residual charges is kept constant, but if the quantity varies, that is, if the pulse width of the transfer clock pulse signal varies, it causes changes in the quantity of the residual charges, and hence in the quantity of the transferred signal charges, and as a result, noise components are produced in the output signal from the CCD.

Under these circumstances, when, for example, the time base compression of a video signal is performed as described above, the transfer clock pulse signal changes from the two-phase transfer clock pulse signal for writing to the two-phase transfer clock pulse signal for reading between the write mode period and the succeeding read mode period, and therefore, the period of the transfer clock pulse signal changes from Tw to Tr, which corresponds to a half of Tw, and the pulse width also changes from Tw/2 to Tr/2. Hence, at the beginning of the read mode period, there occurs a change in the residual charge quantity produced in the bent portion 13a which affects the video signal read out of the CCD with its time base compressed, so that a noise component is produced therein. More particularly, the video signal output from the CCD with its time base compressed tends to include a noise component at the portion corresponding to the signal charge transferred through the bent portion of the charge transfer channel at the beginning of the read mode period. Further, since the positions of the bent portions are fixed and corresponding to certain times in the horizontal period, the noises become fixed pattern noises and very conspicuous.

OBJECTS AND SUMMARY OF THE INVENTION

In view of the aforementioned disadvantages in the prior art, the present invention has as its principal object the provision of a time base compressing and/or expanding apparatus which uses a CCD having its charge transfer channel provided with bent portions therein to compress or expand the time base of an input signal supplied to the CCD and provide the same at the output side of the CCD, and which is capable of effectively reducing the noise components liable to be included in the signal obtained from the output side of the CCD due to the charge transfer operation through the bent portions in the charge transfer channel of the CCD.

In order to achieve the above mentioned object, an apparatus for effecting time base compression or expansion according to the present invention comprises a CCD provided with a charge transfer channel having one or more bent portions formed therein and which is supplied with an input signal, and a drive circuit portion for driving the CCD using a first two-phase transfer clock pulse signal to write the input signal into the CCD and for driving the CCD using a second two-phase transfer clock pulse signal to read from the CCD a signal which is produced from the input signal with its time base compressed or expanded, with the first two-phase transfer clock pulse signal being made up of first and second pulse train signals having a first period and arranged to be 180° out of phase with each other and the second two-phase transfer clock pulse signal being made up of third and fourth pulse train signals having a second period and also arranged to be 180° out of phase with each other, and further, with the pulse width of the first pulse train signal being virtually equal to the pulse width of the third pulse train signal and being selected to be smaller than one-half of the smaller one of the first and second periods.

When time base compression or expansion of an input signal is carried out in a time base compressing and/or expanding apparatus embodying the present invention as described above, writing of the input signal into the CCD is performed by transferring operations of signal charges through the charge transfer channel of the CCD in response to the first two-phase transfer clock pulse signal made up of the first and second pulse train signals and, in succession thereto, reading from the CCD of the signal obtained from the input signal with its time base compressed or expanded is performed by transferring operations of signal charges through the charge transfer channel of the CCD in response to the second two-phase transfer clock pulse signal made up of the third and fourth pulse train signals.

DETAILED DESCRIPTION OF THE PREFERRED EMBODIMENTS

Figure 4:
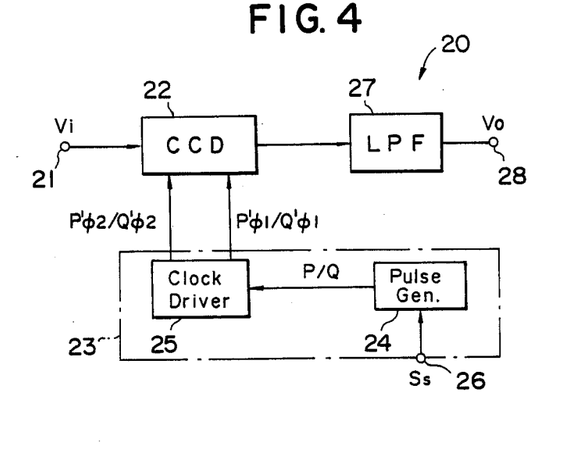
FIG. 4 is a block diagram showing an example of a time base compressing and/or expanding apparatus according to an embodiment of the present invention.

A time base compressing and/or expanding apparatus 20 according to an embodiment of the present invention which is particularly adapted for compressing the time base of a video signal will now be described in detail with reference to FIG. 4 in which an input video signal Vi is shown to be supplied from an input terminal 21 to the input of a CCD 22. The CCD 22 is similar to the CCD 10 described with reference to FIG. 1 and is similarly formed of a semiconductor chip in which a charge transfer channel is defined between channel stop regions and shaped so that the space on the semiconductor chip may be effectively utilized. For this sake, the charge transfer channel has bent portions as indicated at 13a in the charge transfer channel 13 of FIG. 1. The CCD 22 is provided with two-phase type transfer electrodes disposed on its charge transfer channel and is adapted to be driven by two-phase transfer clock pulses applied to the transfer electrodes for effecting writing of the video signal Vi input from the input terminal 21 and reading of the written video signal Vi.

In association with the CCD 22, there is provided a driver circuit 23 consisting of a pulse generator 24 and a clock driver 25 for forming two-phase transfer clock pulse signals for writing and reading, respectively, the video signal Vi in the CCD 22. The pulse generator 24 is supplied with a mode selector signal Ss from a terminal 26.

An output of the CCD 22 is connected through a low-pass filter (LPF) 27 with an output terminal 28 at which an output video signal Vo with a changed time base is derived.

Figure 5A:
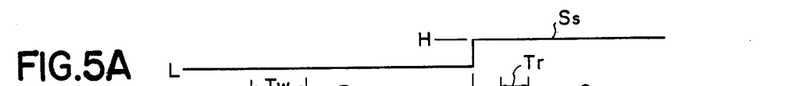
FIGS. 5A to 5D are waveform charts to which reference will be made in explaining operations of the apparatus of FIG. 4.
Figure 5B:
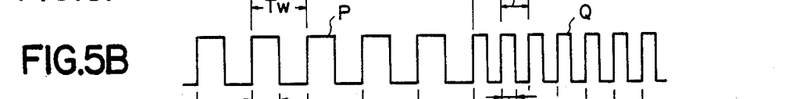
Figure 5C:
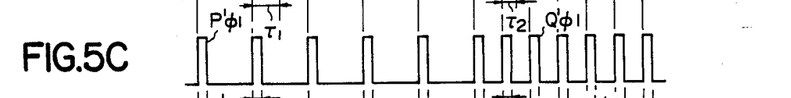

In a first phase of the operation of the apparatus 20, as the video signal Vi from the input terminal 21 is supplied to the input of the CCD 22, the write mode is established, and in the write mode, the mode selector signal Ss from the terminal 26 is at a low level L as shown in FIG. 5A. In response to such low level L of the mode selector signal $S_s$, the pulse generator 24 generates a pulse train signal P formed of successive pulses having a period Tw and a pulse width $\pi 1$ ($=\frac{1}{2}$ Tw) as shown in FIG. 5B and supplies the pulse train signal P to the clock driver 25. The clock driver 25 responding to the pulse train signal P generates, as shown in FIG. 5C, a pulse train signal $P'_{\phi 1}$ formed of successive pulses having a period Tw and a pulse width $\tau_3$ smaller than $\tau\frac{1}{2}$ and as, shown in FIG. 5D, a pulse train signal $P'_{\phi 2}$ formed of successive pulses having a period Tw and a pulse width $\tau_4$ larger than $\tau_1$ and arranged to be 180° out of phase in respect to the pulse train signal $P'_{\phi 1}$. The pulse train signals $P'_{\phi 1}$ and $P'_{\phi 2}$ are supplied from the clock driver 25 to the CCD 22 as the two-phase transfer clock pulse signal for writing. The CCD 22 is driven by the pulse train signals $P'_{\phi 1}$ and $P'_{\phi 2}$, so that signal charges based upon the video signal Vi are transferred through the charge transfer channel of the CCD 22 and the video signal Vi for a predetermined period, for example, one horizontal period, is written into the charge transfer channel of the CCD 22.

Figure 5D:
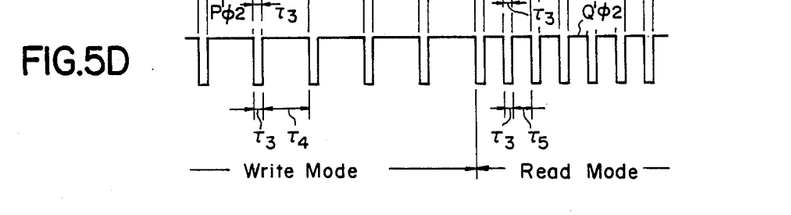

In a next phase of the operation of the apparatus 20, a read mode period succeeds the write mode period and, in accordance therewith, the mode selector signal Ss from the terminal 26 is at a high level H, as shown in FIG. 5A. In response to such high level H of the signal $S_s$, the pulse generator 24 generates a pulse train signal Q formed of successive pulses having a period Tr corresponding, for example, to Tw/2 and a pulse width $\tau_2$ ($=\frac{1}{2}$ Tr) as shown in FIG. 5B, and such pulse train signal Q is supplied to to the clock driver 25. The clock driver 25 responding to the pulse train signal Q generates, as shown in FIG. 5C, a pulse train signal $Q'_{\phi 1}$ formed of successive pulses having a period Tr and a pulse width $\tau_3$ smaller than $\tau_2$ ($=\frac{1}{2}$ Tr) and, as shown in FIG. 5D, a pulse train signal $Q'_{\phi 2}$ formed of successive pulses having a period Tr and a pulse width $\tau_5$ larger than $\tau_2$ and arranged to be 180° out of phase in respect to the pulse train signal $Q'_{\phi 1}$. The pulse train signals $Q'_{\phi 1}$ and $Q'_{\phi 2}$ are supplied from the clock driver 25 to the CCD 22 as the two-phase transfer clock pulse signal for reading. The the CCD 22 is driven by the pulse train signals $Q'_{\phi 1}$ and $Q'_{\phi 2}$, so that signal charges are transferred through the charge transfer channel of the CCD 22 based upon the video signal Vi written therein and the video signal Vi for one horizontal period is read out. by having the video signal Vi written in the CCD 22 as the latter is driven by the two-phase transfer clock pulse signal for writing consisting of the pulse train signals $P'_{\phi 1}$ and $P'_{\phi 2}$ whose period is Tw and then having the signal read out from the CCD 22 as the latter is driven by the two-phase transfer clock pulse signal for reading consisting of the pulse train signals $Q'_{\phi 1}$ and $Q'_{\phi 2}$ whose period is Tr corresponding to Tw/2, the video signal read out of the CCD 22 has its time base compressed to one-half that of the original video signal Vi.

The video signal thus read out of the CCD 22 is delivered through the low-pass filter 27, wherein its clock pulse signal component is removed, to the output terminal 28 at which, a video signal Vo whose time base has been compressed can be obtained.

Figure 3:
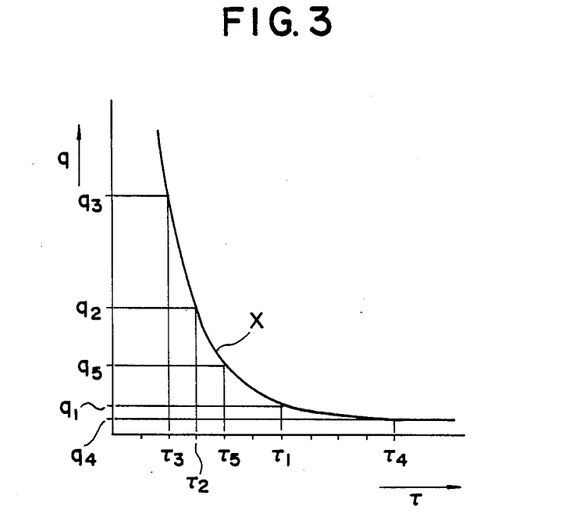
FIG. 3 is a graph to which reference will be made in describing residual charges in the bent portion of the charge transfer channel of the CCD.

The aforementioned pulse widths $\tau_1$ to $\tau_5$, having the following relationship to each other $\tau_3 < \tau_2 < \tau_5 < \tau_1 < \tau_4$. If it is assumed that charge transfers through the charge transfer channel of a CCD 22 are performed by the transfer clock pulse signals having the pulse widths $\tau_1 - \tau_5$, the quantities of the residual charges at the energy "defect" occurring at the bent portion of the charge transfer channel of the CCD 22 will be q1, q2, q3, q4, and q5 for the pulse widths $\tau_1 - \tau_5$, respectively, as indicated in FIG. 3 relative to the curve X and, therefore, the relationship q3 > q2 > q5 > q1 > q4 will exist between these charge quantities q1−q5.

Under these circumstances, when a compression of the time base of a video signal Vi is carried out as described above, the signal transfer through the charge transfer channel of the CCD 22 during the write mode period is performed by the pulse train signal $P'_{\phi 1}$ formed of pulses having the pulse width $\tau_3$ as the clock pulse signal of one phase of the two-phase transfer clock pulse signal and by the pulse train signal $P'_{\phi 2}$ formed of pulses having the pulse width $\tau_4$ as the clock pulse signal of the other phase of the two-phase transfer clock pulse signal. During the succeeding read mode period, the signal transfer through the charge transfer channel is effected by the pulse train signal $Q'_{\phi 1}$ formed of pulses having the pulse width $\tau_3$ as the clock pulse signal of one phase of the two-phase transfer clock pulse signal and by the pulse train signal $Q'_{\phi 2}$ formed of pulses having the pulse width $\tau_5$ as the clock pulse signal of the other phase of the two-phase transfer clock pulse signal. Therefore, at the moment of switching from the write mode to the read mode, the period of the clock pulse signal of the one phase of the two-phase transfer clock pulse signal causing the signal charges to transfer through the transfer channel of the CCD 22 changes from Tw to Tr but the pulse width thereof is kept unchanged at $\tau_3$, whereas the period of the clock pulse signal of the other phase of the two-phase transfer clock pulse signal also changes from Tw to Tr but the pulse width thereof changes from $\tau_4$ to $\tau_5$.

Consequently, the residual charge quantity q3 corresponding to the pulse width $\tau_3$ and the residual charge quantity q4 corresponding to the pulse width $\tau_4$ are produced at the bent portion of the charge transfer channel of the CCD 22 in the write mode, and the residual charge quantity q3 corresponding to the pulse width $\tau_3$ and the residual charge quantity q5 corresponding to the pulse width $\tau_5$ are produced in the read mode. Therefore, only the change from the residual charge quantity q4 to the residual charge quantity q5 is produced as the change in the residual charge quantity at the bent portion of the charge transfer channel of the CCD 22 accompanying the switching from the write mode to the read mode. That is, in switching from the write mode to the read mode, the change in the residual charge quantity at the bent portion of the charge transfer channel of the CCD 22 is not produced by the clock pulse signals of both phases of the two-phase transfer clock pulse signals, but is produced only by the clock pulse signal $P'_{\phi 2}$ and $Q'_{\phi 2}$ of the two-phase transfer clock pulse signals as the change from the residual charge quantity q4 to the residual charge quantity q5 due to the change from the pulse width $\tau_4$ to the pulse width $\tau_5$.

As described above, by making the pulse width $\tau_3$ smaller than one-half of the pulse width $\tau_1$, the pulse width $\tau_4$ is made larger than the pulse width $\tau_1$, and also, the pulse width $\tau_5$ is made larger than the pulse width $\tau_2$. Therefore, both the residual charge quantity q4 and the residual charge quantity q5 are made relatively small, and further, the difference between the residual charge quantity q4 and the residual charge quantity q5, (q5−q4), is made relatively small. Thus, the change in the residual charge quantity from the residual charge quantity q4 to the residual charge quantity q5 is kept relatively small.

Accordingly, the video signal Vo which has had its time base compressed, and which is delivered from the output side of the CCD 22 and through the low-pass filter 27 to the output terminal 28, becomes a signal in which the noise component included therein due to the change in the residual charge quantity at the bent portion of the charge transfer channel of the CCD 22 is effectively reduced.

Further, since the pulse train signals $P'_{\phi 1}$ and $Q'_{\phi 1}$ constituting the clock pulse signals of one phase of the two-phase transfer clock pulse signals during the write mode period and the succeeding read mode period, respectively, are comprised of pulses having the common pulse width $\tau_3$, the video signal Vo which has had its time base compressed, and which is obtained from the output side of the CCD 22 and through the low-pass filter 27 at the output terminal 28, has a stabilized level.

Although the above described example involves an arrangement in which the period Tr of the two-phase transfer clock pulse signal which is supplied to the CCD 22 in the read mode is smaller than the period Tw of the two-phase transfer clock pulse signal which is supplied to the CCD 22 in the write mode, so that compression of the time base of the signal is thereby performed in the CCD 22, the apparatus according to the present invention may also be used for expansion of the time base of the signal in the CCD 22 by making the period of the two-phase transfer clock pulse signal supplied to the CCD 22 in the read mode larger than the period of the two-phase transfer clock pulse signal supplied to the CCD 22 in the write mode. In such a case, the pulse train signals formed of pulses having the common pulse width and which are used as the clock pulse signals of one phase of the two-phase transfer clock pulse signals during the write mode period and the succeeding read mode period are selected to be signals having a common pulse width smaller than the pulse width of the pulse train signal supplied from the pulse generator 24 during the write mode period.

Figure 6:
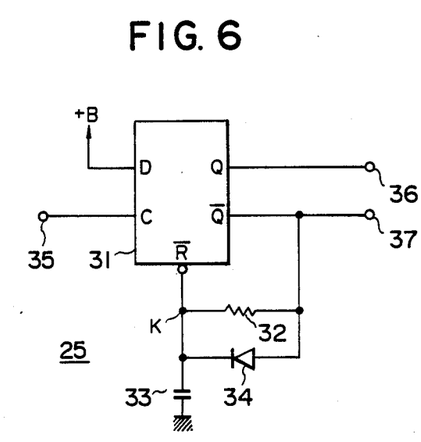
FIG. 6 is a circuit diagram showing a preferred arrangement of a clock driver included in the apparatus of FIG. 4.

The construction and operation of the clock driver 25 of FIG. 4 will now be described in detail with reference to FIGS. 6 and 7. As described above, the transfer pulse width $\tau_3$ of the transfer clock pulse signal corresponds to a very short period of time (for example, tens of n sec). In order to generate such transfer clock pulse signal with a constant pulse width, it becomes necessary to use, for example, a high speed device, such as, an ECL, as a monostable multivibrator for generating the pulse signal. However, if such a device is used, the power consumption becomes large and the circuit itself might become large and expensive. Therefore, by way of example, a circuit arrangement is employed for the clock driver 25 which is free of such disadvantages and which, as shown in FIG. 6, includes a D-type flip-flop 31 formed, for example, of a high speed C-MOS. The input terminal D of the D flip-flop 31 is connected to a power supply terminal +B, the inverting output terminal $\overline{Q}$ of the D flip-flop 31 is grounded through a series circuit of a resistor 32 and a capacitor 33, the junction point K of the resistor 32 and the capacitor 33 is connected with the reset terminal $\overline{R}$ of the D flip-flop 31, and the resistor 32 is shunted by a diode 34. An input terminal 35 to be supplied with input pulse signals, i.e., the pulse train signals P, Q in the present example, is connected with the clock terminal C of the D flip-flop 31 and output terminals 36 and 37 of the latter are lead out from the noninverting output terminal Q and the inverting output terminal $\overline{Q}$ of the same.

Figure 7A:
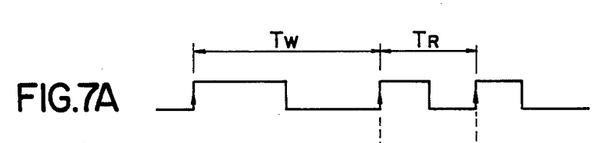
FIGS. 7A–7D are waveform charts to which reference will be made in explaining the operations of the circuit diagram of FIG. 6.
Figure 7B:
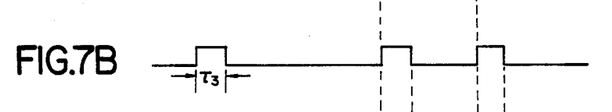
Figure 7C:
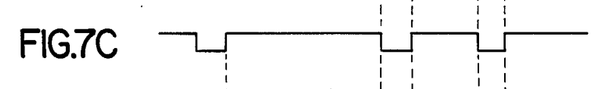
Figure 7D:
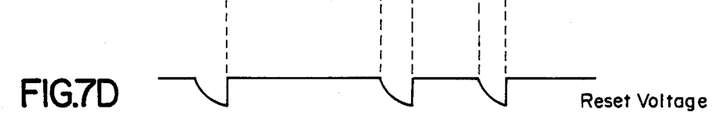

In the example of FIG. 6, at the timing of the leading edge of a pulse signal supplied to the input terminal 35, the signal obtained at the inverting output terminal $\overline{Q}$ of the D flip-flop 31 goes from high level "1" to low level "0". As a result, the electric charges stored on the capacitor 33 during the period at high level "1" is gradually discharged through the resistor 32 until, after a predetermined period of time, the voltage at the junction point K is lowered to the reset voltage whereby the D flip-flop 31 is reset. In this case, such predetermined period of time can be adjusted by changing the values of the resistor 32 and the capacitor 33, and it is set, as described below, to $\tau_3$ in the present example. When the D flip-flop 31 is reset, the signal obtained from its inverting output terminal $\overline{Q}$ goes from low level "0" to high level "1", and thereupon, the capacitor 33 is quickly charged through the diode 34. Therefore, when a pulse signal, for example, as shown in FIG. 7A, is supplied to the input terminal 35 of the clock driver circuit 25 of FIG. 6, there appear pulse signals as shown in FIGS. 7B and 7C at the output terminals 36 and 37. These pulses correspond to the pulses shown in FIGS. 5C and 5D. FIG. 7D shows the variations in voltage at the junction point K.

The application of time base compressing and expanding apparatus embodying the present invention to the compressing and expanding of color-difference signals R-Y, B-Y will now be described with reference to FIGS. 8 and 10.

Figure 8:
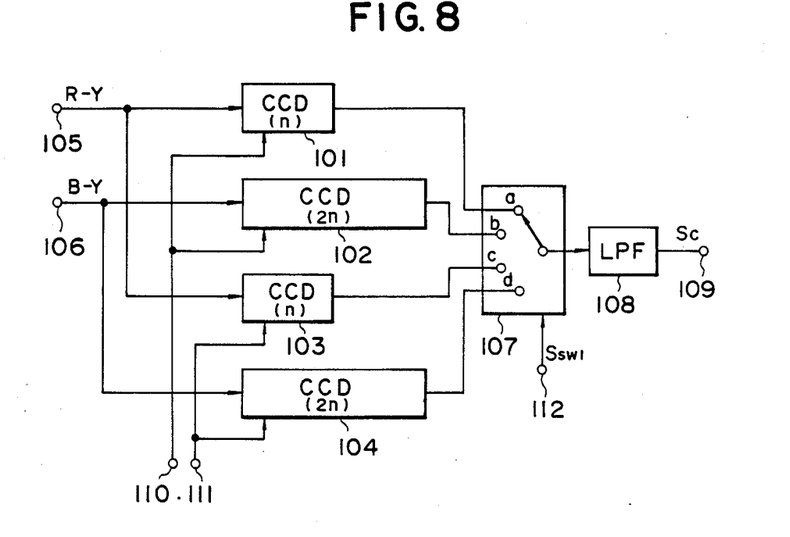
FIG. 8 is a block diagram showing a color-difference signal compressing apparatus to which the present invention is applied.
Figure 9A:
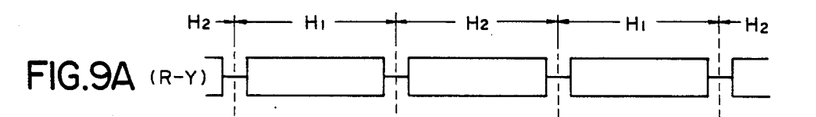
FIGS. 9A–9E are charts to which reference will be made in explaining operations of the apparatus of FIG. 8.
Figure 9B:
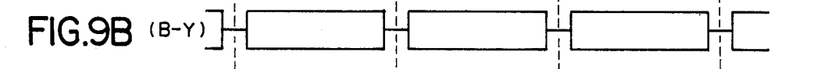

The apparatus of FIG. 8 is shown to include CCDs 101 and 103, each having the number of bits for one horizontal period (n bits), and CCDs 102 and 104 each having the number of bits for two horizontal periods ($2n$ bits). The CCDs 101, 103 are supplied with the red color-difference signal R-Y (FIG. 9A) from a terminal 105, and the CCDs 102, 104 are supplied with the blue color-difference signal B-Y (FIG. 9B) from another terminal 106. Output signals of the CCDs 101-104 are, respectively, supplied to fixed contacts or terminals a-d of a switch circuit 107 and the output signal of the switch circuit 107 is led out to an output terminal 109 through a low-pass filter 108.

During two successive horizontal periods $H_1$, $H_2$, a clock signal (FIG. 9D) is supplied from a terminal 110 to the CCDs 101, 102. As shown, one clock pulse at frequency $f_c$ is supplied during the first horizontal period $H_1$ and two clock pulses at frequency $2f_c$ are supplied during the second horizontal period $H_2$. Also, during the two successive horizontal periods $H_1$, $H_2$, a clock signal (FIG. 9E) is supplied from a terminal 111 to the CCDs 103, 104. As shown, two clock pulses at frequency $2f_c$ are supplied during the first horizontal period $H_1$ and one clock pulse at frequency $f_c$ is supplied during the second horizontal period $H_2$.

The switch circuit 107 is supplied with a control signal $S_{sw1}$ from a terminal 112 and by which the switch circuit 107 is switched so as to connect its output to the fixed contacts c, d, a, and b, during the first half and second half of the first horizontal period $H_1$ and during the first half and the second half of the second horizontal period $H_2$, respectively.

With the above described arrangement, in response to the clock pulse at the frequency $f_c$ during the first horizontal period $H_1$, the color-difference signals R-Y and B-Y for one horizontal period are written into the CCD 101 and the first half of the CCD 102, respectively. Further, in response to the clock pulse at the frequency $2f_c$ during the first half of the succeeding second horizontal period $H_2$, the color-difference signal R-Y for one horizontal period is read out from the CCD 101, while the color-difference signal B-Y which has been written in the first half of the CCD 102 is transferred to the second half. The color-difference signal R-Y read out from the CCD 101 is delivered through the switch circuit 107 and the low-pass filter 108 to the output terminal 109. Then, in response to the clock pulse at the frequency $2f_c$ during the second half of the second horizontal period $H_2$, the color-difference signal B-Y for one horizontal period is read out from the CCD 102, and this color-difference signal B-Y is delivered through the switch circuit 107 and the low-pass filter 108 to the output terminal 109.

Moreover, in response to the clock pulse at the frequency $f_c$ during the second horizontal period $H_2$, the color-difference signals R-Y and B-Y for one horizontal period are written into the CCD 103 and the first half of the CCD 104, respectively. Thereafter, in response to the clock pulse at the frequency $2f_c$ during the first half of the succeeding first horizontal period $H_1$, the color-difference signal R-Y for one horizontal period is read out from the CCD 103, while the color-difference signal B-Y which has been written in the first half of the CCD 104 is transferred to the second half. The color-difference signal R-Y read out from the CCD 103 is delivered through the switch circuit 107 and the low-pass filter 108 to the output terminal 109. Then, in response to the clock pulse at the frequency $2f_c$ during the second half of the first horizontal period $H_1$, the color-difference signal B-Y for one horizontal period is read out from the CCD 104, and this color-difference signal B-Y is delivered through the switch circuit 107 and the low-pass filter 108 to the output terminal 109.

Figure 9C:
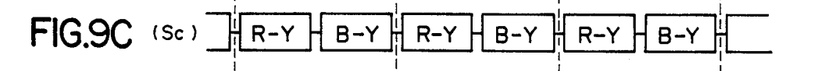
Figure 9D:
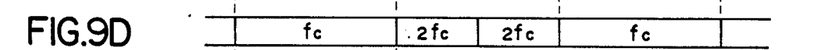
Figure 9E:
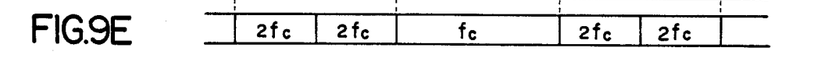

Accordingly, there is obtained from the output terminal 109, a signal $S_c$ in which the color-difference signals R-Y, B-Y are each compressed to one-half their original length along the time base and thereby time-divisionally multiplexed as shown in FIG. 9C.

According to the example described above, the clock pulses are continuously supplied to the CCDs 101–104, and therefore, the lattice defect noise due to the partially broken clock pulse can be prevented from occurring.

Figure 10:
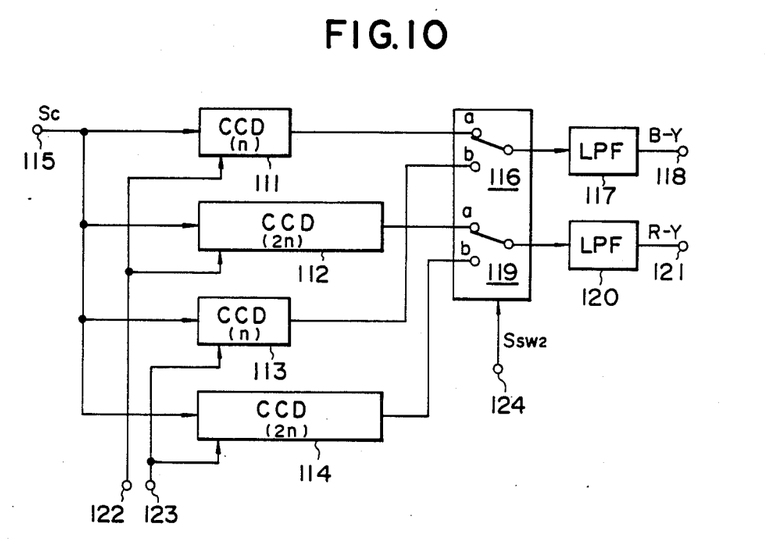
FIG. 10 is a block diagram showing a color-difference signal expanding apparatus to which the present invention is applied.

FIG. 10 shows a time base expanding circuit for obtaining the original color-difference signals R-Y, B-Y from the time-divisionally multiplexed signal $S_c$.

Figure 11A:
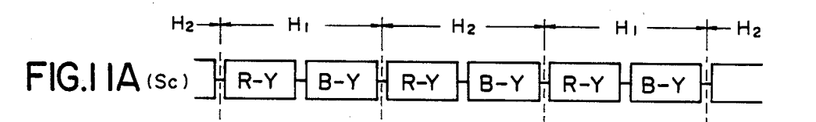
FIGS. 11A–11E are charts to which reference will be made in explaining operations of the apparatus of FIG. 10.

The apparatus of FIG. 10 is shown to include CCDs 111 and 113 each having the number of bits for one horizontal period (n bits), and CCDs 112 and 114 each having the number of bits for two horizontal periods (2n bits). The CCDs 111–114 are supplied with the time-divisionally multiplexed signal $S_c$ (FIG. 11A) from a terminal 115. Output signals of the CCDs 111 and 113 are supplied to terminals a and b of a switch circuit 116, respectively, and the output signal of the switch circuit 116 is led out to an output terminal 118 through a low-pass filter 117. Similarly, output signals of the CCDs 112 and 114 are supplied to terminals a and b of a switch circuit 119, respectively, and the output signal of the switch circuit 119 is led out to an output terminal 121 through a low-pass filter 120.

Figure 11B:
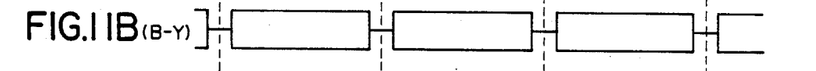
Figure 11C:
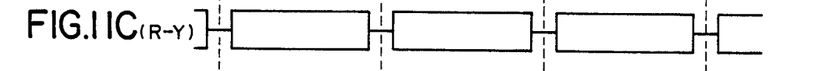
Figure 11D:
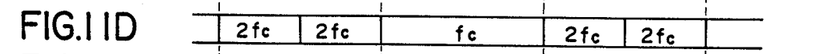
Figure 11E:
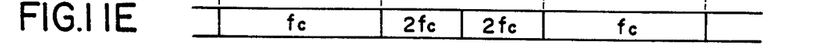

During two successive horizontal periods $H_1$, $H_2$, a clock signal shown in FIG. 11D is supplied from a terminal 122 to the CCDs 111, 112. Thus, two clock pulses at the frequency $2f_c$ are supplied during the first horizontal period $H_1$ and one clock pulse at the frequency $f_c$ is supplied during the second horizontal period $H_2$. During the two successive horizontal periods $H_1$, $H_2$, a clock signal shown in FIG. 11E is supplied from a terminal 123 to the CCDs 113, 114. Thus, one clock pulse at the frequency $f_c$ is supplied to CCDs 113 and 114 during the first horizontal period $H_1$ and two clock pulses at the frequency $2f_c$ are supplied to such CCDs during the second horizontal period $H_2$.

The switch circuits 116, 119 are supplied with a control signal $S_{sw2}$ from a terminal 124 and these switch circuits 116, 119, which are ganged, are switched so as to be connected to their respective terminals b and a during the first horizontal period $H_1$ and the second horizontal period $H_2$, respectively.

With the above described arrangement, in response to the clock pulse at the frequency $2f_c$ during the first half of the first horizontal period $H_1$, the color-difference signal R-Y for one horizontal period is written into the CCD 111 and into the first half of the CCD 112. In response to the clock pulse at the frequency $2f_c$ during the second half of the first horizontal period $H_1$, the color-difference signal B-Y for one horizontal period is written into the CCD 111 and into the first half of the CCD 112, while the color-difference signal R-Y for one horizontal period which has been written in the first half of the CCD 112 is transferred to the second half of the latter. Thereafter, in response to the clock pulse at the frequency $f_c$ during the succeeding second horizontal period $H_2$, the color-difference signals B-Y and R-Y are each read out for one horizontal period from the CCDs 111 and 112 and delivered through the switch circuits 116 and 119 and the low-pass filters 117 and 120 to the output terminals 118 and 121, respectively.

Further, in response to the clock pulse at the frequency $2f_c$ during the first half of the second horizontal period $H_2$, the color-difference signal R-Y for one horizontal period is written into the CCD 113 and into the first half of the CCD 114. In response to the clock pulse at the frequency $2f_c$ during the second half of the second horizontal period $H_2$, the color-difference signal B-Y for one horizontal period is written into the CCD 113 and into the first half of the CCD 114, while the color-difference signal R-Y for one horizontal period which has been written in the first half of the CCD 114 is transferred to the second half of the latter. Then, in response to the clock pulse at the frequency $f_c$ during the succeeding first horizontal period $H_1$, the color-difference signals B-Y and R-Y are each read out for one horizontal period from the CCDs 113 and 114 and delivered through the switch circuits 116 and 119 and the low-pass filters 117 and 120 to the output terminals 118 and 121, respectively.

Accordingly, the blue color-difference signal B-Y and the red color-difference signal R-Y, each expanded twofold along the time base, as shown in FIGS. 11B and 11C are continuously obtained at the output terminals 118 and 121.

The clock pulses are also continuously supplied to the CCDs 111–114 in the time base expanding circuit of FIG. 10, and, therefore, the lattice defect noise can be prevented from occurring in this case to.

In the apparatus for compressing and/or expanding the time base according to the present invention, as described above, the CCD therein having a charge transfer channel with one or more bent portions made therein is supplied with an input signal and the writing of the input signal into the CCD and the reading of the written signal from the CCD are carried out in response improved transfer clock pulse signals by which the input signal supplied to the CCD can be output from the output side of the CCD with its time base compressed or expanded, and further by which the noise component, which might otherwise result from the signal charge transfer operation through the bent portion of the charge transfer channel of the CCD, is effectively excluded from the output signal delivered to the output side of the CCD with its time base compressed or expanded.

Moreover, since the writing of the input signal into the CCD and the reading out of the written signal from the CCD are performed according to the improved transfer clock pulse signals, the output signal delivered to the output side of the CCD with its time base compressed or expanded has a stabilized level.

Although illustrative embodiments of the invention have been described in detail herein with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. Apparatus for compressing and/or expanding the time base of an input signal, comprising:

charge coupled device means having an input terminal supplied with said input signal, an output terminal, first and second clock terminals, and a charge transfer channel having at least one bent portion and through which charges corresponding to said input signal are transferred with the direction of the charge transfer being changed at said at least one bent portion at which some charges remain as a residual charges resulting in noise, clock generating means for generating a write clock signal and a read clock signal in a time-divisional manner, said read clock signal and said write clock signal having a read clock period and a write clock period, respectively, which are different in length from each other, and clock driver means supplied with one of said write and read clock signals selectively for generating first and second pulse trains to be supplied to said first and second clock terminals, respectively, when said write clock signal is supplied and for generating third and fourth pulse trains to be supplied to said first and second clock terminals, respectively, when said read clock signal is supplied, said first pulse train being 180° out of phase in respect to said second pulse train and said third pulse train being 180° out of phase in respect to said fourth pulse train, said first pulse train and said third pulse train having respective pulse widths that are equal to each other, and that are each smaller than one-half of the shorter one of said write clock period and read clock period, whereby to reduce said noise due to residual charges in said bent portion of the charge transfer channel.

2. Apparatus for compressing and/or expanding the time base of an input signal according to claim 1, wherein said write clock signal and read clock signal have 50% duty cycles.

3. Apparatus for compressing and/or expanding the time base of an input signal according to claim 1, wherein said write clock period is longer than said read clock period so that the time base of said input signal is compressed.

4. Apparatus for compressing and/or expanding the time base of an input signal according to claim 1, wherein said write clock period is shorter than said read clock period so that the time base of said input signal is expanded.

5. Apparatus for compressing and/or expanding the time base of an input signal, comprising charge coupled device means having an input terminal supplied with said input signal, an output terminal, first and second clock terminals, and a charge transfer channel through which the charge corresponding to said input signal is transferred and which has at least one bent portion at which the direction of the charge transfer is changed, clock generating means for generating a write clock signal and a read clock signal in a time-divisional manner, said read clock signal and said write clock signal having a read clock period and a write clock period, respectively, which are different in length from each other, and clock driver means including a D-type flip-flop having a data input terminal connected to a first reference voltage source, first and second output terminals, a reset terminal and a clock terminal, a series circuit of a resistor and a capacitor connecting one of said output terminals to a second reference voltage source, a diode shunting said resistor, said reset terminal being connected to a junction point between said resistor and capacitor, and said clock terminal of said D-type flip-flop being selectively supplied with said write and read clock signals from said clock generating means, said clock driver means generating first and second pulse trains to be supplied from said first and second output terminals of said D-type flip-flop to said first and second clock terminals, respectively, of said charge coupled device means when said write clock signal is supplied to said clock terminal of the flip-flop and generating third and fourth pulse trains to be supplied from said first and second output terminals of said D-type flip-flop to said first and second clock terminals, respectively, of the charge coupled device means when said read clock signal is supplied to said clock terminal of the flip-flop, said first pulse train being 180° out of phase in respect to said second pulse train and said third pulse train being 180° out of phase in respect to said fourth pulse train, said first pulse train and said third pulse train having respective pulse widths that are equal to each other, and that are each smaller than one-half of the shorter one of said write clock period and read clock period, whereby to reduce noise due to residual charges in said bent portion of the charge transfer channel.

* * * * *